United States Patent

Nauta et al.

[11] Patent Number: 5,710,526
[45] Date of Patent: Jan. 20, 1998

[54] PHASE-LOCKED LOOP FOR SIGNALS HAVING RECTANGULAR WAVEFORMS

[75] Inventors: Hendrikus Cornelis Nauta, Berkel en Rodenrijs; Johannes Wilhelmus T. Eikenbroek, Emmen; Adrianus G. A. van der Arend, Rijswijk, all of Netherlands

[73] Assignee: Ericsson Radion Systems B.V., Va Emmen, Netherlands

[21] Appl. No.: 693,281

[22] PCT Filed: Dec. 15, 1995

[86] PCT No.: PCT/NL95/00422

§ 371 Date: Aug. 15, 1996

§ 102(e) Date: Aug. 15, 1996

[87] PCT Pub. No.: WO96/19043

PCT Pub. Date: Jun. 20, 1996

[30] Foreign Application Priority Data

Dec. 15, 1994 [NL] Netherlands ............... 9402129
Mar. 13, 1995 [NL] Netherlands ............... 9500491

[51] Int. Cl.⁶ ............... H03L 7/08; H03L 7/085; H03L 7/10; H03L 7/191
[52] U.S. Cl. ............... 331/25; 331/1 A; 331/14; 331/17; 327/156; 327/159
[58] Field of Search ............... 331/1 A, 10–12, 331/14, 16, 17, 25, 34; 327/156–159

[56] References Cited

U.S. PATENT DOCUMENTS 4,888,564 12/1989 Ishigaki ................... 331/1 A
5,148,123  9/1992 Ries ....................... 331/4
5,216,387  6/1993 Telewski et al. ........... 331/11

OTHER PUBLICATIONS

Patent Abstracts of Japan, vol. 3, No. 90 (E-127), Jul. 31, 1979 [JP-A 54 067751].
Duk-Kyu Park et al., "Fast Acquisition Frequency Synthesizer with the Multiple Phase Detectors", IEEE Pacific Rim Conference on Communications Computers and Signal Processing, vol. 2, May 9, 1991, New York, pp.665–668.

Primary Examiner—David Mis
Attorney, Agent, or Firm—Burns, Doane, Swecker & Mathis, L.L.P.

[57] ABSTRACT

Phase-locked loop (for signals having rectangular waveforms, comprising, in series, a phase detector, a control signal generator circuit having a loop filter, a controlled oscillator and an auxiliary circuit. The detector recieves a reference signal having a reference frequency from a reference source as first input signal. The detector recieves second and third input signals from the auxiliary circuit. The reference signal and the second input signal are compared by a first logic combination function to deliver a second combination signal. The second and third input signals are compared by a second logic combination function to deliver a second combination signal. The second and third input signals are such that, in the locked state of the loop, the frequency of the second input signal is equal to the reference fequency and the frequency of the second combination signal is equal to twice the reference frequency and the duty cycle of the second combination signal differs from the duty cycle of the reference signal. The difference between the two combination signals is delivered to the control signal generator circuit. For a frequency difference between the first and second input signals of the detector, the control signal generator circuit controls the oscillator so as to set the oscillator frequency in a direction towards an extreme oscillator frequency. If the loop does not lock while traversing this path, the control signal generator circuit will adjust the loop and control the oscillator in such a way that the oscillator fequency is set in the opposite direction towards a second extreme frequency. The two extreme oscillator frequencies are chosen below and above the desired oscillator frequency, respectively.

42 Claims, 11 Drawing Sheets

PHASE-LOCKED LOOP FOR SIGNALS HAVING RECTANGULAR WAVEFORMS

BACKGROUND

The invention relates to a phase-locked loop.

Such a phase-locked loop is disclosed, for example, in the book entitled "Samenvattingen van de post-academische cursus Phase Lock Loop"("Summaries of the post-academic course entitled Phase Lock Loop"), Delft Technical University, Electronics Department, January 1980, pages 99 to 101 inclusive. In the latter, use is made of a phase detector comprising a single digital multiplier, for example an exclusive OR gate, a NAND gate or an OR gate. The input signals of the detector have a square waveform. The detector has a transfer characteristic f(θ), θ being the phase difference between the input signals, one of which is a reference signal, of the detector having a cyclic triangular waveform which is completely above f(θ)=0, with a minimum at f(0±M 360°), where M is an integer (see FIG. 5 of this application). The loop is so adjusted that in the locked state, that is to say with no frequency difference between the input signals of the detector, θ=90°, i.e. the two input signals of the detector are shifted by 90° with respect to one another, as a result of which the detector provides, in the locked state ("in-lock"), an output signal having a pulsed form with a frequency which is twice the reference frequency and whose pulse width is equal to ¼ of the cycle of the reference signal. In the locked state, or quiescent state, of the loop, the detector therefore provides a strongly pulsating output signal, said pulses forming the so-called ripple of the output signal of the detector in the locked state, in which state the control signal has a quiescent level for the oscillator. Because the pulses have a high energy content, they have a strongly disturbing influence on the frequency stability of the output signal of the oscillator. Because it is a point half way up the slopes of the triangular transfer characteristic of the detector which is the equilibrium point for the locked state of the loop, the output signal of the detector is independent of a frequency difference between the input signals of the detector as seen over a number of cycles of the reference signal, all the phase differences between the input signals of the detector being traversed; or in other words, the averaged output signal of the detector as seen over a number of cycles of the reference signal is independent of a frequency difference between the input signals of the detector. In the case of a frequency difference between the input signals of the detector which is great with respect to the loop bandwidth, the capture will take place slowly or in a creeping manner, which is very undesirable for many applications of the phase-locked loop.

SUMMARY

The object of the invention is to improve the known phase-locked loop.

This object is achieved by means of the phase-locked loop according to the present invention. As a result, in the case of a frequency difference between the reference signal and another input signal of the phase detector, the oscillator receives a control signal which rapidly sets the loop to the locked state.

Preferably, the phase-locked loop is constructed to provide a cyclic transfer characteristic f(θ) having a triangular waveform for which f(θ)=0 in the locked state of the loop. The points of the triangular waveforms occur at an interval of 180° and not at θ=0. The equilibrium point of the loop is therefore on a slope at θ=0. As a result, no ripple appears, in principle, on the output signal of the detector in the locked state, as a result of which the oscillator is not disturbed by such a ripple and the oscillator delivers a more stable output frequency in the locked state. With imperfect operation of the loop in the locked state, only a small ripple occurs which has a small energy content and double the frequency of the reference frequency, which ripple is easy to remove or to minimize.

Since, when a frequency difference occurs between the input signals of the phase detector, the oscillator is driven in such a way that the oscillator frequency moves towards one of the extreme oscillator frequencies and then reverses direction, the immediate capture range will be capable of being reached rapidly in any situation involving a frequency difference between the input signals of the detector.

As is explained below, the reaching of an extreme oscillator frequency and the subsequent reversal of the direction of the frequency change towards the other oscillator frequency can take place in various ways. The immediate capture range of the loop is reached particularly rapidly if, when an extreme oscillator frequency is reached, the polarity of the output signal of the phase detector upstream of, or in, the control signal generator is only reversed in polarity instead of another signal having a polarity which is reversed with respect to the polarity of the detector signal being supplied to the loop filter.

Known phase detectors which do not generate any subharmonics of the reference frequency have the disadvantage that they have a dead zone in the quiescent region of the loop. A detector having such a dead zone gives rise to increased phase noise of the oscillator. The loop according to the invention does not generate any subharmonics, but there is no dead zone, as a result of which no increased oscillator phase noise occurs.

Known phase-locked loops, in which a sequential phase detector is used, for example an SPD ("sequential phase detector") or an SFPD ("sequential frequency and phase detector"), which are also described in the above-mentioned book entitled "Samenvattingen van de postacademische cursus Phase Lock Loop", make use of one or more memory elements (flip-flops) in which case, as a result of different delays and different finite switching times of logic elements and as a result of instability of the switching levels of the logic elements of the detector and, consequently, undefined logic state combinations, parasitic ("spurious") signals may occur in the output signal of the detector and which signals disturb the operation of the loop. As a result of the absence of such memory elements in the phase detector of the invention, the disadvantageous effect of such parasitic signals is largely absent. This is despite the fact that the detector according to the invention receives not only the reference signal of the auxiliary circuit, but also two input signals which are time-dependent on one another. The effect of any parasitic signals which may nevertheless occur can readily be suppressed according to the invention.

BRIEF DESCRIPTION OF THE DRAWINGS

The invention will be explained below by reference to the drawings. In the drawings.

DETAILED DESCRIPTION

Figure 1:
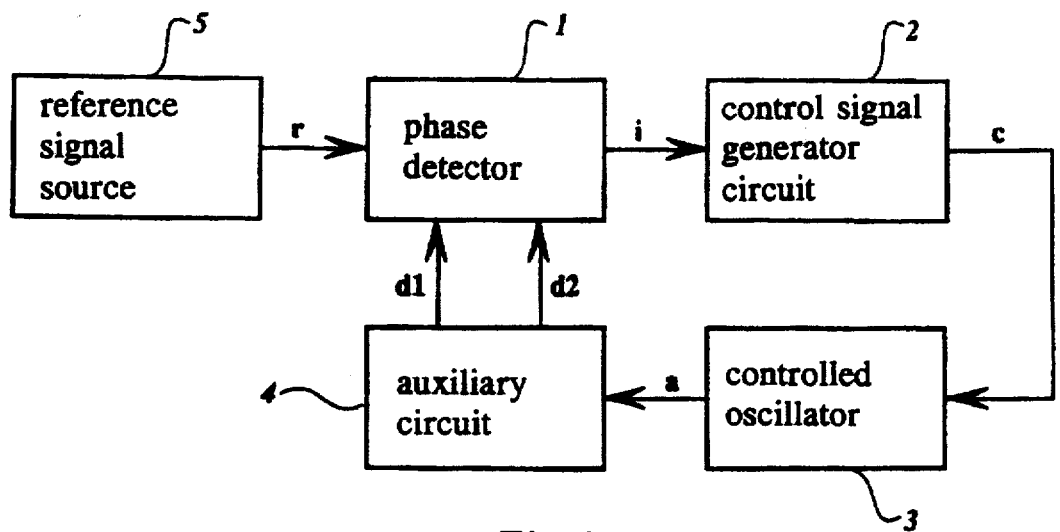
FIG. 1 shows a general block diagram of a phase-coupled loop according to the invention.

The diagram shown in FIG. 1 of a phase-locked loop (PLL) according to the invention comprises, in series, a phase detector 1, a control signal generator circuit 2, a controlled oscillator 3 and an auxiliary circuit 4. The phase detector 1 delivers an output signal i to the control signal generator circuit 2, which delivers an oscillator control signal c to the controlled oscillator 3 which delivers an output signal a having a frequency $f_a$ controlled by the oscillator control signal c to the auxiliary circuit 4, which delivers two output signals d1, d2 to the phase detector 1. The phase detector 1 furthermore receives a reference signal r having a reference frequency $f_r$ from outside the loop, for example from a reference signal source 5, whose type is dependent on the application of the loop. Which of the abovementioned signals i, c, a, d1, d2 is regarded as output signal of the loop is also dependent on the application of the loop.

If the control signal generator circuit 2 in FIG. 1 were to consist of a loop filter and the phase detector 1 were to receive only one of the signals d1, d2, the configuration shown in FIG. 1 would be a configuration of a known phase-locked loop. In such a loop, the phase detector 1 compares a phase difference between the reference signal r and another input signal of the phase detector 1 and delivers an output signal which is dependent thereon and which is converted by the loop filter into an oscillator control signal for the controlled oscillator having a level which is such that the said phase difference is set to a predetermined value. The predetermined value of the phase difference is fixed by the chosen type of phase detector. In the case of some types of phase detector, the averaged level of the output signal as seen over a number of cycles of the reference signal is, in addition, dependent on the occurrence of a difference between the reference frequency $f_r$ and the frequency of the other input signal of the phase detector, the loop being designed in such a way that said frequency difference is minimized. In that case, the generally so-called creeping capture occurs for a large initial frequency difference. As the frequency difference becomes smaller, the loop enters the so-called immediate capture range of the loop in which capture range the phase difference is rapidly minimized. If the frequency difference is zero and the phase difference has the predetermined value, the loop is so-called locked ("in-lock").

The object of the invention is to provide an improved phase-coupled loop in which rapid capture occurs even in the case of a large frequency difference and the operation is not disturbed by a ripple in the output signal of the phase detector in the locked state of the loop, nor by parasitic ("spurious") signals which may occur as a consequence of different inertias and different switching characteristics of logic elements, nor by a dead zone of the transfer characteristic of the phase detector which could cause increased phase noise.

The invention will be explained below by reference to the figures in which embodiments and the operation of a phase-coupled loop according to the invention are shown. For the purpose of the explanation, it will be assumed that the input signals of the phase detector 1 have square waveforms. The invention is not, however, limited to square waveforms.

Figure 2:
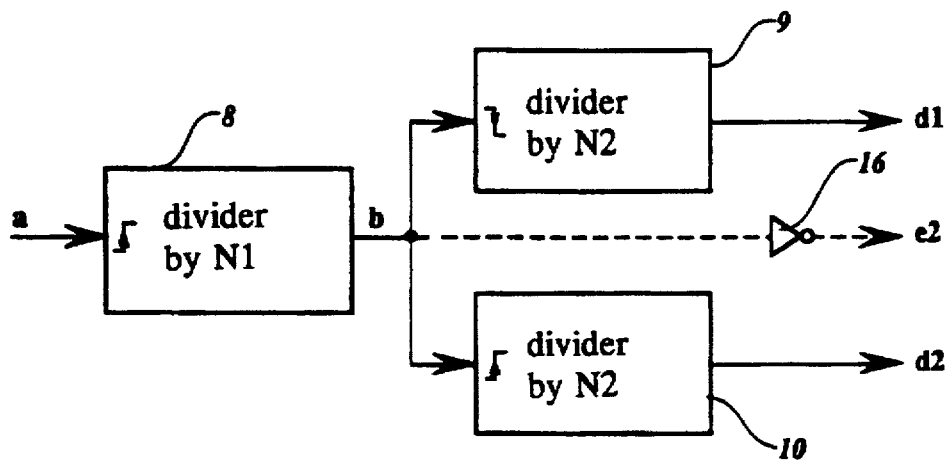
FIG. 2 shows a detailed diagram of an embodiment of the auxiliary circuit of FIG. 1.
Figure 4:
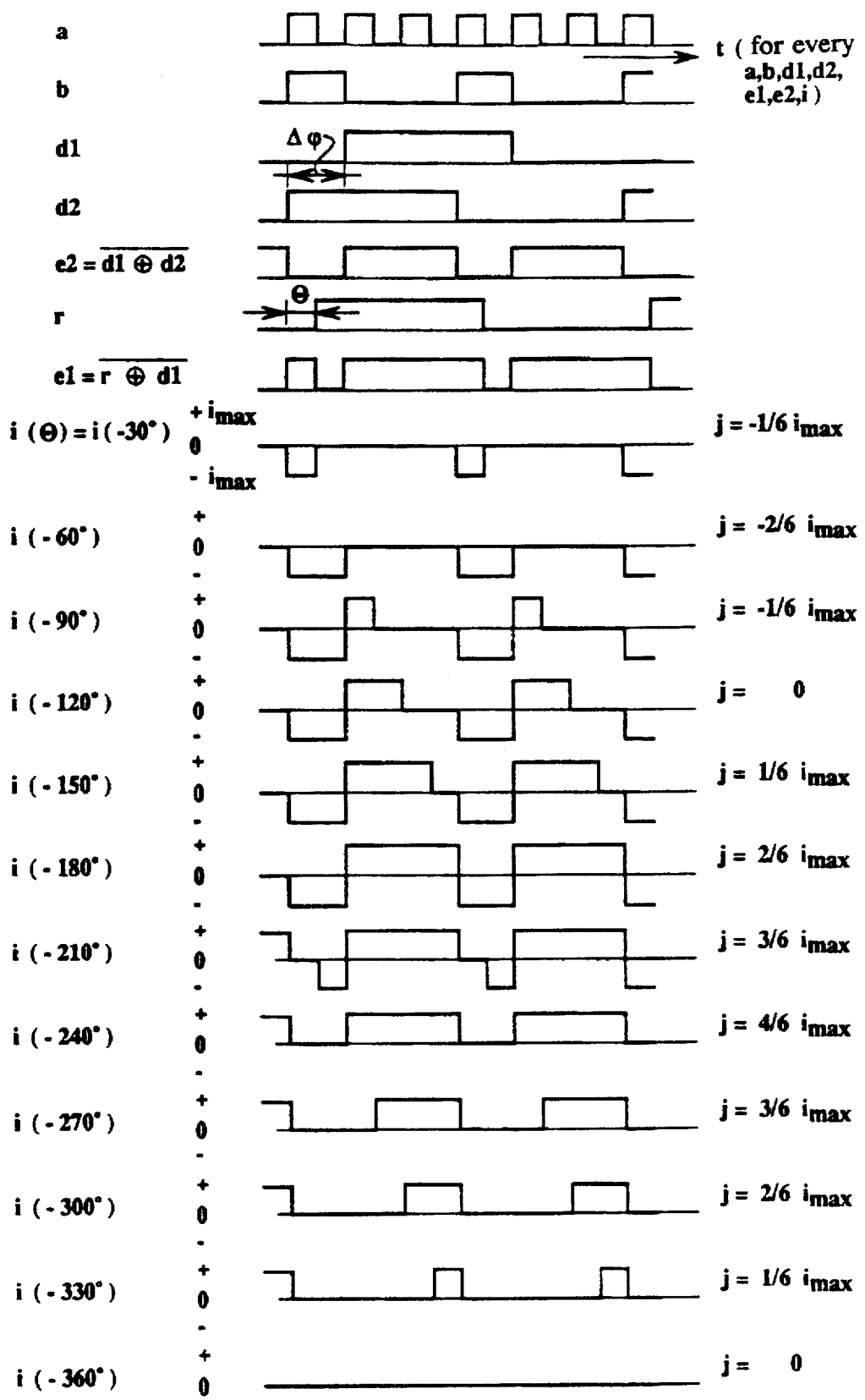
FIG. 4 shows a time diagram of waveforms of signals which occur in the diagrams of FIGS. 1 to 3 inclusive for identical frequencies of the input signals of the phase detector and for a number of values of the phase difference θ between said input signals.

FIG. 2 shows an embodiment of the auxiliary circuit 4 of FIG. 1. The auxiliary circuit 4 comprises a first divider 8, which receives the output signal a of the oscillator 3 and which divides the frequency $f_a$ of said signal a by a first factor N1 and which delivers an output signal b corresponding thereto. The auxiliary circuit 4 furthermore has a second divider 9 and a third divider 10, which both receive the output signal b of the first divider 8 and which divide said signal b by a second factor N2 and which deliver an output signal d1 or d2, respectively. The first and third dividers 8, 10 switch at rising edges of the input signal a or b and the second divider 9 switches at the trailing edge of the input signal b. The first division factor N1 is such, or the first divider 8 has a logic combinatorial circuit for combining internal signals of the first divider 8 which is such that a duty cycle $N_d$ of the output signal b of the first divider 8 is not equal to a duty cycle of the reference signal r. Because, as has been assumed, the reference signal r has a square waveform, the duty cycle of the reference signal is 0.5 and the duty cycle of the output signal b of the first divider 8 is between 0 and 1 but is not equal to 0.5. As an example, N1=3 and N2=2 has been chosen, resulting in a total division factor N=N1×N2=6. As a result, the waveforms of the signals a, b, d1, d2 shown in FIG. 4 are obtained, the edges of the signals d1, d2 having the same polarity being shifted with respect to one another over an interval Δφ=360°/N of the cycle of the signals d1 and d2 and Δφbeing=60° in the example. The duty cycle $N_d$ of the output signal b of the first divider 8 is given by $N_d=\Delta\phi/180°$ and, in the example, $N_d=\frac{1}{3}$.

The signals r, d1 and d2 form respectively first, second and third input signals of the phase detector 1. From the time diagrams of FIG. 4 and from the explanation of the auxiliary circuit 4 by reference to FIG. 2, it will be possible to understand that the square waveform of the signals d1 and d2 and the phase difference Δφ between them can also be obtained in another way. If the output signal of the oscillator a has, for example, the same frequency as that of the intended signals d1 and d2, the output signal of the oscillator a can form one of the signals d1 or d2 and the other signal d2 or d1, respectively, can be derived therefrom by phase shift, for example by passing the oscillator output signal a through a series of gates. The use of dividers in the auxiliary circuit 4 has, however, the advantages that the frequency $f_r$ of the reference signal r is lower than the frequency of the output signal a of the oscillator 3, which is desirable for a number of applications, and that the loop can be used over a wide range of the reference frequency $f_r$ without the performances deteriorating as a result of a relatively greater or smaller influence of the virtually fixed gate delay times.

Owing to the additional third input signal d2 of the phase detector 1, the loop is designed to deliver, in the event of the occurrence of a frequency difference between the reference frequency $f_r$ of the reference signal r and the frequency of the other two input signals d1 and d2 of the detector 1, a level of the output signal i of the detector 1 to the control signal generator circuit 2 which is averaged in such a way that the latter delivers an oscillator control signal c to the oscillator 3 for the purpose of adjusting the frequency of the oscillator output signal a in order to reduce the said frequency difference subsequently. The loop is furthermore designed so that, in the immediate capture range of the loop, the oscillator 3 is driven so as to reduce a phase difference 74 between the reference signal r and the second input signal d2 of the detector 1.

Figure 3:
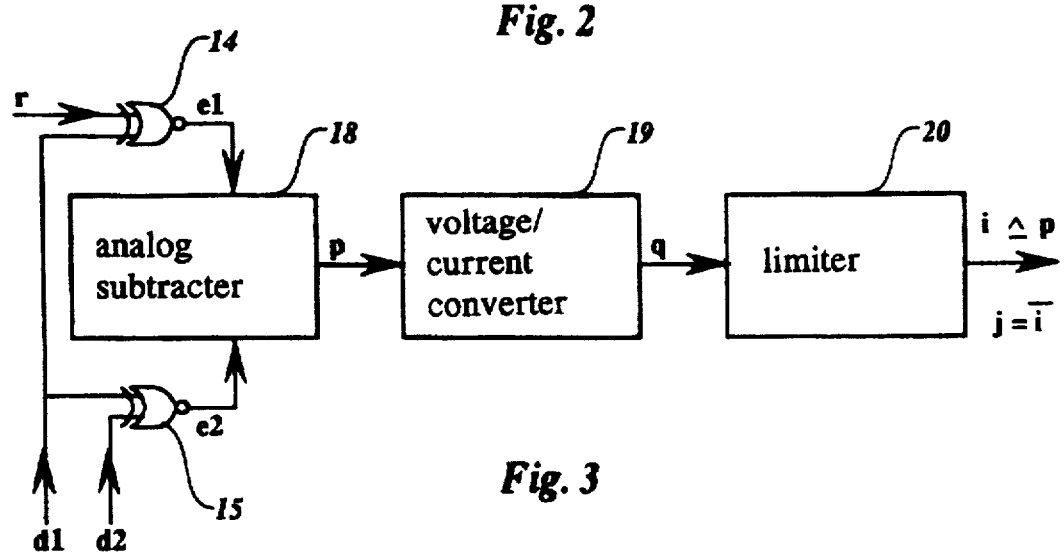
FIG. 3 shows a detailed diagram of an embodiment of the phase detector of FIG. 1.

FIG. 3 shows the diagram of an embodiment of the phase detector 1 of the embodiment of the loop according to the invention. The detector 1 has, according to this diagram, a first inverting exclusive OR (XNOR) gate 14 and a second inverting exclusive OR (XNOR) gate 15. The first gate 14 receives the reference signal r and the output signal d1 of the auxiliary circuit 4 at its two inputs. The gate 15 receives the two output signals d1 and d2 of the auxiliary circuit 4 at its two inputs. Each of the gates 14 and 15 supplies a logic high level to its output if its input signals have equal logic levels and, if not, the gate supplies a logic low level to its output. In this connection, because the gates 14 and 15 compare, as it were, signal levels, the output signals d1 and d2 will also be termed first comparison signal d1 and second comparison signal d2, respectively.

The first gate 14 delivers an output signal which is termed first combination signal e1 and the second gate 15 delivers an output signal which is termed second combination signal e2. The first and second combination signals e1 and e2 are shown in FIG. 4. From the latter, it is evident that he second combination signal e2 has a waveform which is inverted with respect to the waveform b. The second combination signal e2 could therefore also be derived by means of an inverter of the signal b. Such an inverter 16 is shown in FIG. 2. If the inverter 16 were used, the third divider 10 and the second inverting exclusive OR gate 15 could be omitted. In order to limit the effect of transit time differences of the signals d1 and e2, however, the third divider 10 and the second gate 15 as shown are nevertheless used instead of the inverter 16.

The phase detector 1 comprises, as shown in FIG. 3, an analog subtracter 18 which subtracts the first combination signal e1 from the second combination signal e2 and which delivers an output signal p (voltage) to a voltage/current converter 19. The converter 19 delivers an output signal q (current) to a limiter 20 which limits an output current i of the latter to $\pm i_{max}$. The limiter 20 is not necessary for the application of the principle of the invention. The output signal i of the limiter 20 also forms the output signal i of the detector 1, whose waveform is, in the exemplary embodiment explained here, equal to the waveform of the output signal p of the subtracter 18. The averaged value of the output signal i of the detector for a phase difference 74 and viewed over one cycle time of the reference signal r is indicated by j or ī.

In a practical embodiment, the gates 14 and 15 were designed to deliver currents which could easily be subtracted from one another and which rendered the converter 19 superfluous.

In addition to the abovementioned waveforms r, a, b, c, d1, d2, e1, e2, FIG. 4 shows the waveforms i(θ) for the output signal i of the detector and the said averaged value j= ī of i for a number of values (−30°, −60°, . . . , 360°) of the phase difference θ between the second comparison signal d2 and the reference signal r.

Figure 6:
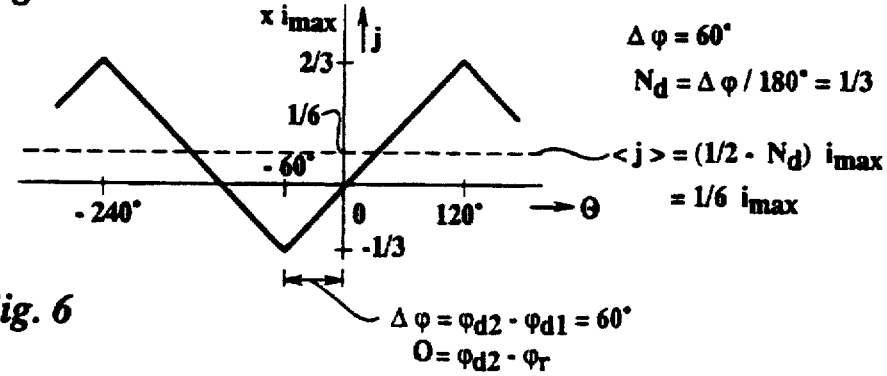

If the connection between the detector 1 and the control signal generator circuit 2 or the connection between the control signal generator circuit 2 and the oscillator is considered to be interrupted and, furthermore, it is assumed that the frequency difference between the input signals r, d1, d2 (or r, d1, e2) is zero, the oscillator 3 receiving a constant control signal c, all the waveforms of i(θ) shown in FIG. 4 will be cyclic and continue infinitely. As a result, the averaged value j of the output signal i of the detector 1 is easy to calculate and the transfer characteristic f(θ) of the phase detector 1 is easy to plot. FIG. 6 shows the transfer characteristic f(θ) of the detector 1 for the given example with $\Delta\phi=60°$, for which $N_d=\Delta\phi/180°=\frac{1}{3}$.

For a frequency difference between the reference signal r and the other input signals of the detector 1, all the values of θ will, if observed long enough, be traversed. In that case, that is to say, if a frequency difference occurs between the input signals of the detector, an averaged value <j> of the output signal i of the detector 1 can be written over all the values of the phase difference θ as $<j>=(\frac{1}{2}-N_d)i_{max}$. In the example of FIG. 6 it is then true that $<j>=\frac{1}{6}\times i_{max}$.

It is pointed out that the formula given above is valid for <j> in the example in which the input signals r, d1, d2 of the detector have square waveforms. Another variation in f(θ) and another value of <j> apply for other waveforms of said signals. However, the invention continues to be valid.

If the imaginary interruption of the loop is now no longer considered to be present, said averaged value $<j>=\frac{1}{6}\times i_{max}$, which is therefore not equal to f(0)=0 (the equilibrium point), will concomitantly help the loop to adjust itself differently in order to minimize the frequency difference between the reference signal r and the other input signals of the detector 1.

Figure 5:
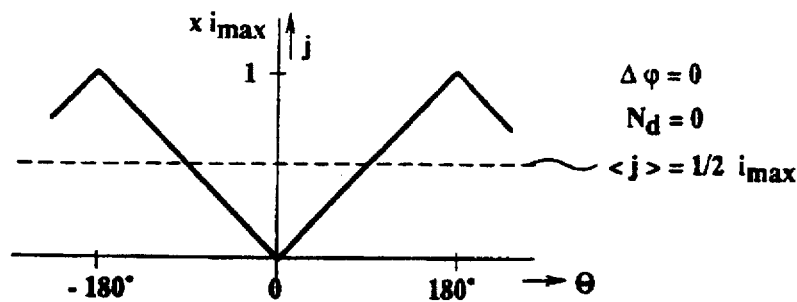
FIGS. 5 to 9 inclusive show transfer characteristics f(θ) for various specific duty cycles N of a signal derived from the oscillator and delivered to a subtracter of the phase detector.

If it were true that $N_d=0$, the transfer characteristic f(θ) shown in FIG. 5 would be obtained. In the case of FIG. 5, although the averaged value <j> of the output current i of the detector 1 is greater, in the event of a frequency difference between the input signals of the detector 1, than in the case of FIG. 6 and said greater value would be capable of resulting in a more significant control signal c, the characteristic is, as can be seen in FIG. 5, symmetrical with respect to θ=0 for θ<0 and θ>0, so that the loop is unable to respond in the desired manner to a phase difference around θ=0 in the capture range. The equilibrium point will finish up at θ=90° just as in the known PLL having a phase detector which comprises a single OR or exclusive OR gate. The drawback of this is that the equilibrium point is $j=i_{max}/2$ and $<j>=i_{max}/2$, as a result of which the detector provides, in the locked state ("in-lock"), an output signal having a pulsed form with a frequency which is twice the reference frequency and whose pulse width is equal to ¼ of the cycle of the reference signal. In the locked state, or quiescent state, of the loop, a strongly pulsating output signal having a high frequency is thus delivered by the detector, these pulses forming the so-called ripple of the output signal of the detector in the locked state, in which state the control signal for the oscillator has a quiescent level. Because the pulses have a high energy content, they have a strongly interfering effect on the frequency stability of the output signal of the oscillator. Because the equilibrium point is given by a point half way up the slopes of the triangular transfer characteristic of the detector for the locked state of the loop, the output signal of the detector is independent of a frequency difference between the input signals of the detector as viewed over a number of cycles of the reference signal, all the phase differences between the input signals of the detector being traversed. Or, in other words, the averaged output signal of the detector is, as seen over a number of cycles of he reference signal, independent of a frequency difference between the input signals of the detector. In the case of a frequency difference between the input signals of the detector which is wide with respect to the loop bandwidth, the capture will take place slowly or in a creeping manner, which is very undesirable for many applications of the phase-locked loop.

Figure 9:
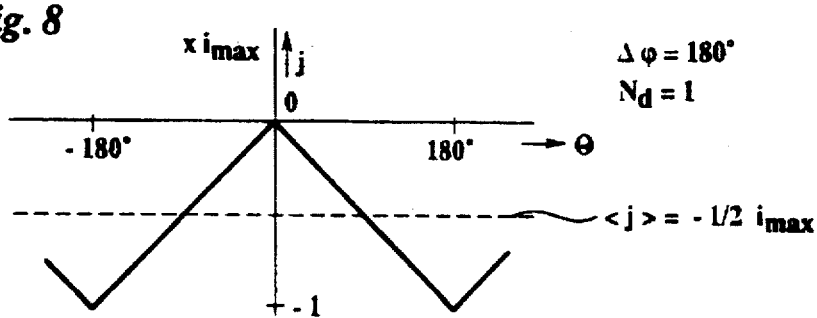

If the duty cycle of the output signal of the hird divider 8 of the auxiliary circuit 4 were to be $N_d=1$, the transfer characteristic $f(\theta)$ of the detector 1 shown in FIG. 9 would be obtained. It is evident that the characteristics shown in FIGS. 5 and 9 are mirror images with respect to the line $f(\theta)=0$, with the result that the same drawbacks apply to the case of FIG. 9 as the case of FIG. 5.

Figure 7:
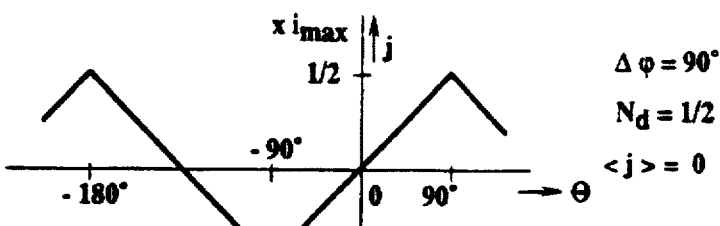

FIG. 7 shows the transfer characteristic for the case where $N_d=\frac{1}{2}$ is valid for the duty cycle of the signal b of the first divider 8 of the auxiliary circuit 4. In this case, the loop is able to respond in the desired manner in the immediate capture range around a phase difference $\theta=0$. The averaged value $<j>$ of the output signal i of the detector 1 is, however, 0 for a frequency difference between the input signals of the detector 1, as a result of which the loop is unable to respond adequately to such a frequency difference.

Figure 8:
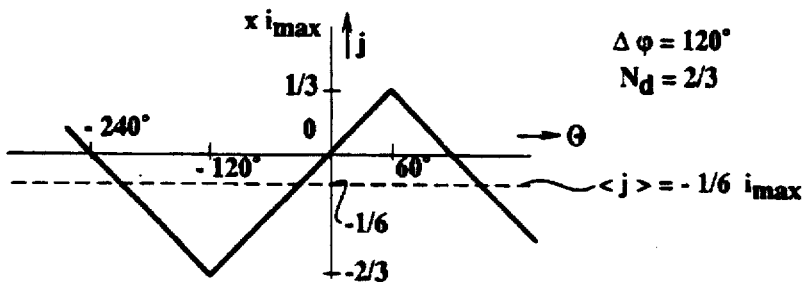

The object of the invention is therefore to deliver, to the positive input of the analog subtracter 18 of the detector 1, a signal (the second combination signal e2) whose duty cycle $N_d$ is between 0 and 1 but not equal to ½ for a square waveform of the reference signal r. FIGS. 6 and 8 show, as an example, transfer characteristics $f(\theta)$ for $N_d=\frac{1}{6}$ and $N_d=\frac{5}{6}$, respectively, with $<j>=\frac{1}{6} i_{max}$ and $<j>=-\frac{1}{6} i_{max}$, respectively, which meet this requirement.

Figure 10:
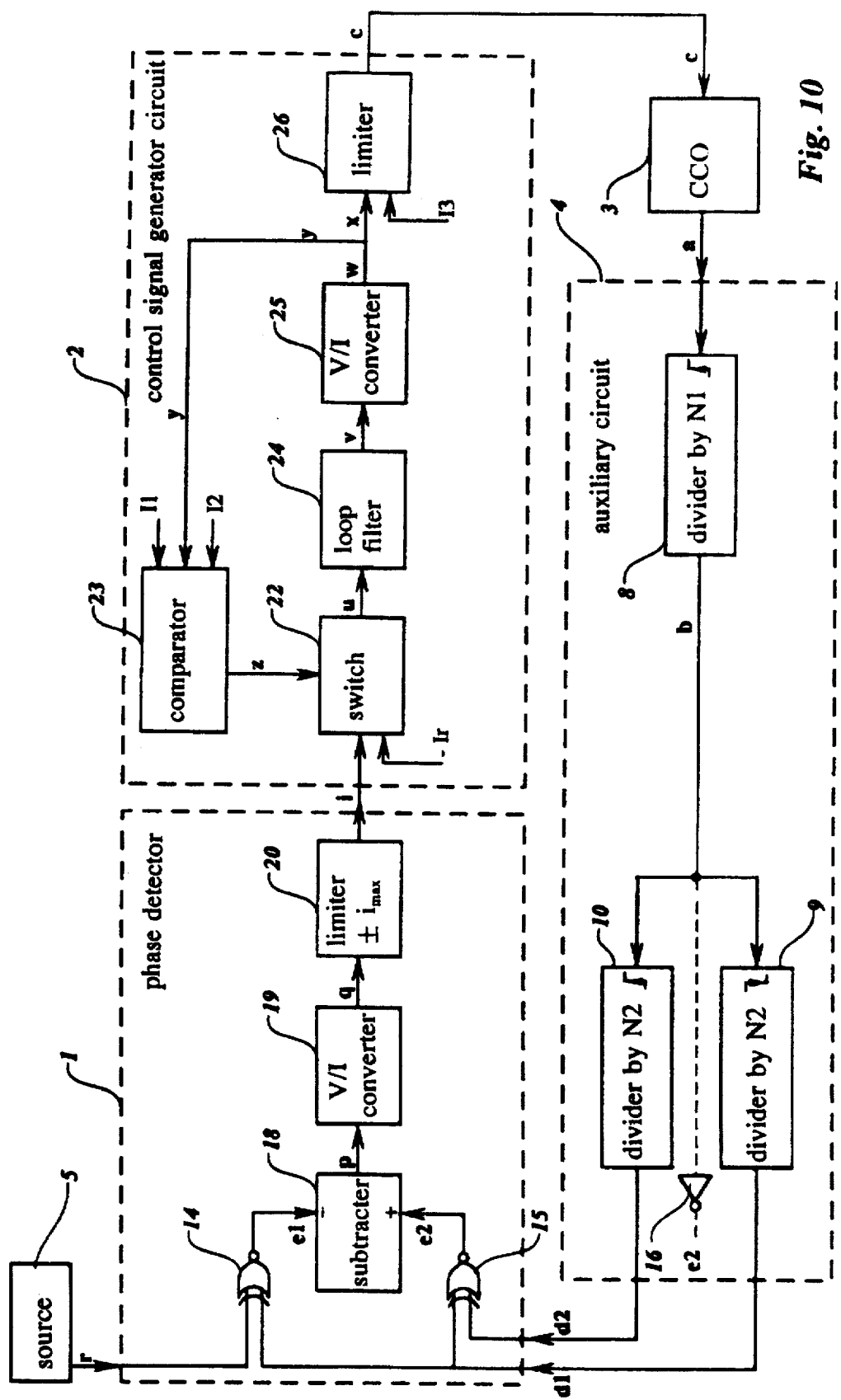
FIG. 10 shows a more detailed diagram of a first embodiment of a phase-locked loop according to the invention.

FIG. 10 shows a more detailed diagram of a first embodiment of the phase-locked loop according to the invention. The control signal generator 2 shown in the diagram of FIG. 10 comprises a switch 22 which receives the output signal i (current) of the phase detector 1 and a control signal-return signal −Ir (a negative current). The switch 22 also receives a return control signal z as output signal of a comparator 23. The switch 22 provides an output signal u (current) to a loop filter 24 which provides an output signal v (voltage) to a voltage/current converter 25 which delivers an output signal w (current) whose proportional components x, y are delivered to a limiter 26 and to the comparator 23, respectively. As an alternative to the converter 25, a voltage/current converter could be used which does not deliver a common output signal w but which delivers via separate internal paths thereof the signals x and y for the limiter 26 and the comparator 23, respectively.

Figure 11:
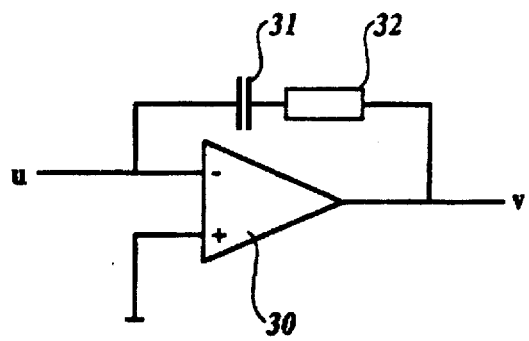
FIG. 11 shows a diagram of an embodiment of the loop filter of the loop shown in FIG. 10.

The loop filter 24 is preferably an active loop filter having a transfer characteristic with an integrating term, for example of a type as shown in FIG. 11 and consisting of an amplifier 30 with negative return having a series circuit of a capacitor 31 and a resistor 32 between its output and inverse input. The input receives the signal (current) u and the output delivers the signal (voltage) v. Without the integrating term rapid locking may still occur, but a phase difference of $\theta \neq 0$ may remain.

The comparator 23 furthermore receives a first reference level I1 (current) and a second reference level I2 (current). The limiter 26 limits the input signal x (current) thereof to a third reference level I3. The limiter 26 delivers the output signal c (current) of the control signal generator circuit 2 to an input of the controlled oscillator 3 which is in this case a current-controlled oscillator (CCO). This has been chosen because a current-controlled oscillator offers advantages in implementing the loop.

It is assumed that, if a frequency difference occurs between the reference signal r and the other input signals d1 and d2, the phase characteristic $f(\theta)$ of the detector 1 delivers an output signal i whose averaged value $<j>$ is positive (see, for example, FIG. 6 for $N_d=\frac{1}{6}$), that, with an increasing level of the input signal u (current) of the loop filter 24, its output signal v (voltage) increases and that the output signal w (current) of the converter 25 and the derived signals x and y, the oscillator control signal c and the frequency of the oscillator output signal a increase in harmony therewith. Under these conditions, the choice I1>I2 is valid.

The operation of this embodiment of the loop will now be explained by reference to FIG. 12, which shows a characteristic of the oscillator control current c as a function of time, that is to say c(t). Depending on the position of the switch 22, the loop may be in a first state or in a second state. In the first state the switch allows the output curent i of the detector 1 through to the loop filter 24 and, in the second state, the switch 22 allows the return current −Ir through to the filter 24.

It is assumed that the initial frequency $f_a$ of the output signal a of the oscillator 3 is higher at time zero than a desired frequency $f_w$ of N=N1×N2 (in the example, six) times the reference frequency ft (f, is, for example, 480 MHz) and that the loop is in the first state, the loop filter 24 receiving the pulse-type output signal i from the detector 1. In response to the received pulse-type input current i, the loop filter 24 will deliver a flattened voltage v which will increase as a consequence of the frequency difference present between the first and second input signals r, d1 of the phase detector 1. As a result, the converter 25 will deliver an increasing current w and the limiter 26 will also deliver a control current c which increases with time. When the comparator 23 detects that the current derived from the converter 25 goes above the first reference level I1, the return control signal z from the comparator 23 actuates the switch 22 so as to set the loop to the second state to allow the return current −Ir through the switch 22 to the loop filter 24 instead of the output current i of the detector 1. The said initial state of the loop is shown in FIG. 12 at t=0 and the instant mentioned last at which the loop goes from the first to the second state occurs in FIG. 12 at t=500 ns. At that instant, the output signal a of the oscillator 3 has a maximum frequency $f_{max}$. In the second state, the loop filter 24 receives the return current −Ir, as a result of which the output current w of the converter 25 and the oscillator control current c from the limiter 26 will decrease. If the current x reaches the relatively low third reference level I3, the limiter 26 limits the oscillator control current c to this level. At that instant, the output signal a of the oscillator 3 has a minimum frequency $f_{max}$, which is lower than the desired frequency $f_w$. If, at this same instant, or only after the output current w of the converter 25 has decreased further (as a result of which the characteristic of FIG. 12 has a (short) horizontal lower-most section), the input current y of the comparator 23 reaches the second reference level I2, the return control signal z from the comparator 23 actuates the switch 22 so as to allow the output current i of the detector 1 through again to the loop filter 24 instead of the return current −Ir and so as thereby to set the loop back to the first state. This switching point occurs in FIG. 12 at approximately the time t=1.3 µs.

After setting the loop back from the second state to the first state, the output current i of the detector 1 will, as a consequence of the frequency difference still present (but with another sign) and the still positive averaged value <i> of said current i, increase the output current w of the converter 25 and the level of the oscillator control current c again until the immediate capture range of the loop is reached, for which region the frequency f, of the output signal a of the oscillator 3 is equal to or virtually equal to N×f,. This situation is reached in the example of FIG. 12 at approximately t=1.7 μs.

Figure 12:
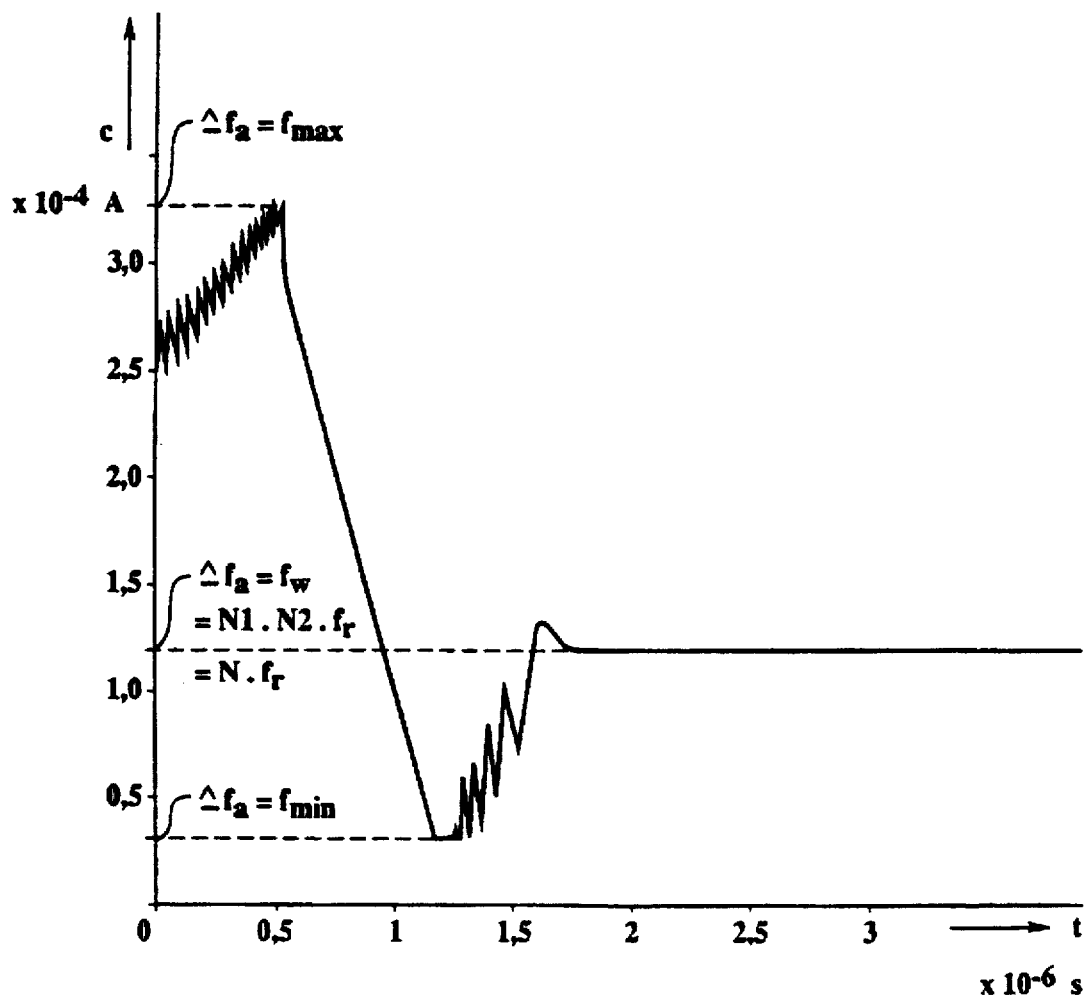
FIG. 12 shows a characteristic of the control signal of the oscillator as a function of time for the occurrence of an initial oscillator frequency which is higher than a desired oscillator frequency.

The speed with which the capture range is reached from the initial state shown in FIG. 12 at t=0 can be altered by choosing another duty cycle $N_d$ of the output signal b of the first divider 8 of the auxiliary circuit 4 and another value of the return current −Ir, and by another choice of the control range of the oscillator 3 by means of a suitable choice of the reference levels I1, I2 and I3.

The first embodiment shown in FIG. 10 of the loop according to the invention is relatively simple in that a relatively simple switch 22 and the constant return current −Ir are used. Viewed over a number of different initial situations, this embodiment gives a more rapid reaching of the immediate capture range of the loop than known phase-locked loops. However, a phase-locked loop which, even when viewed over different initial situations, can reach the immediate capture range of the loop still more rapidly can be obtained by a few changes to the diagram of FIG. 10. FIGS. 21 to 25 inclusive show second to sixth embodiments, inclusive, of the loop according to the invention, with which this more rapid capture can be achieved. Their general operation will first be explained by reference to FIGS. 13 to 20 inclusive. FIGS. 13 to 20 inclusive show the oscillator frequency $f_a$ as a function of time. In FIGS. 13, 15, 17 and 19, the initial oscillator frequency $f_a$ is between the minimum oscillator frequency $f_{MIN}$ and the desired oscillator frequency $f_w$. In FIGS. 14, 16, 18 and 20, the initial oscillator frequency $f_a$ is between the desired oscillator frequency $f_w$ and the maximum oscillator frequency $f_{max}$. In each of the FIGS. 13 to 20 inclusive, the time is indicated at which the desired oscillator frequency $f_w$ is reached after starting from the initial situation. This time is indicated in FIGS. 13 to 20 inclusive by $t_{13}$, $t_{14}$, $t_{15}$, $t_{16}$, $t_{17}$, $t_{18}$, $t_{19}$ and $t_{20}$, respectively.

Figure 13:
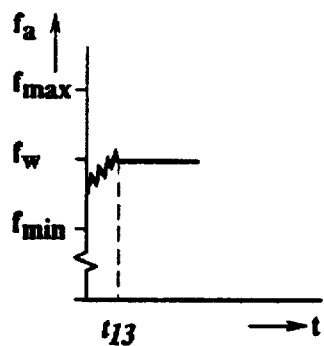
FIGS. 13 to 20 inclusive show characteristics illustrating various possible operations of various embodiments of the phase-locked loop according to the invention.
Figure 14:
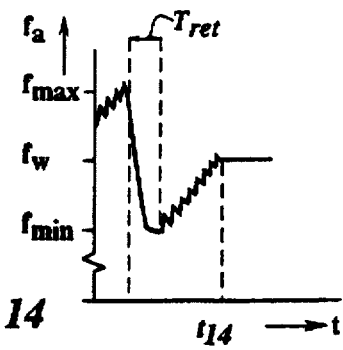

FIGS. 13 and 14 apply to the operation of the first embodiment, explained by reference to FIG. 10, of the phase-locked loop according to the invention. The time in which the switch 22 allows the return current −Ir through instead of the output current i of the phase detector 1 is the return time (or return time) $T_{ret}$. During the return time $T_{ret}$ the output signal i of the phase detector 1 has no influence on the operation of the loop, as a result of which said time $T_{ref}$ can be regarded as lost for the rapid reaching of the desired oscillator frequency $f_w$.

Figure 15:
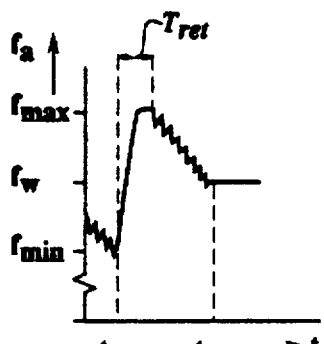
Figure 16:
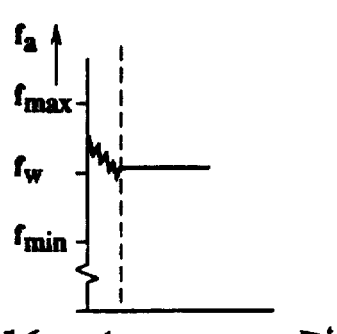
Figure 17:
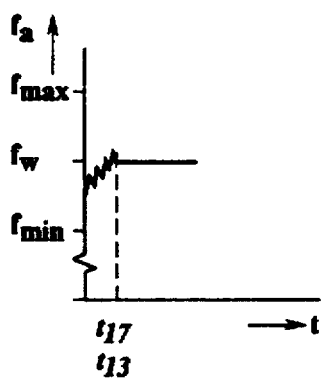
Figure 18:
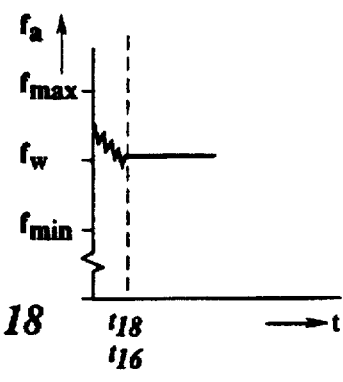

With a suitable choice of the polarities of the various signals and of a suitable response direction of the oscillator 3 of the diagram in FIG. 3, an operation according to FIGS. 15 and 16 is possible according to the same principle as in FIG. 10. In FIGS. 15 and 16, the slopes of the characteristics are reversed only with respect to FIGS. 13 and 14.

By ensuring that the input signal u of the loop filter 24 is reversed in polarity on reaching an extreme frequency $f_{MIN}$ or $f_{max}$, an operation according to FIGS. 17 to 20 inclusive can be obtained by reversing the polarity of the actual detector output signal i.

Figure 19:
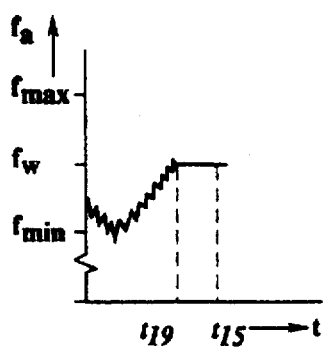
Figure 20:
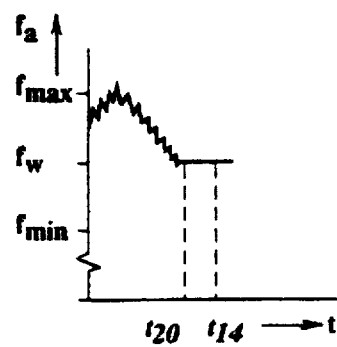

If the initial oscillator frequency $f_a$ is not equal to the desired oscillator frequency $f_w$, the initial oscillator frequency $f_a$ has, in 50% of the cases, a value which results in the oscillator frequency $f_a$ being repelled further from the desired oscillator frequency $f_w$. These situations are shown in FIGS. 14, 15, 19 and 20. In the situations of FIGS. 19 and 20, however, the time loss of the return time $T_{ret}$ does not occur, so that it can be stated globally for all the initial situations (leaving $f_a=f_w$ out of consideration) that, in the case of an operation according to FIGS. 17 to 20 inclusive, a time gain of the magnitude of the return time $T_{ret}$ can be achieved in 50% of the cases, in other words, that the phase-locked loop reaches the immediate capture range in a time $T_{ret}$ which is more rapid in the embodiment according to FIGS. 10 and 13 to 16 inclusive.

Figure 21:
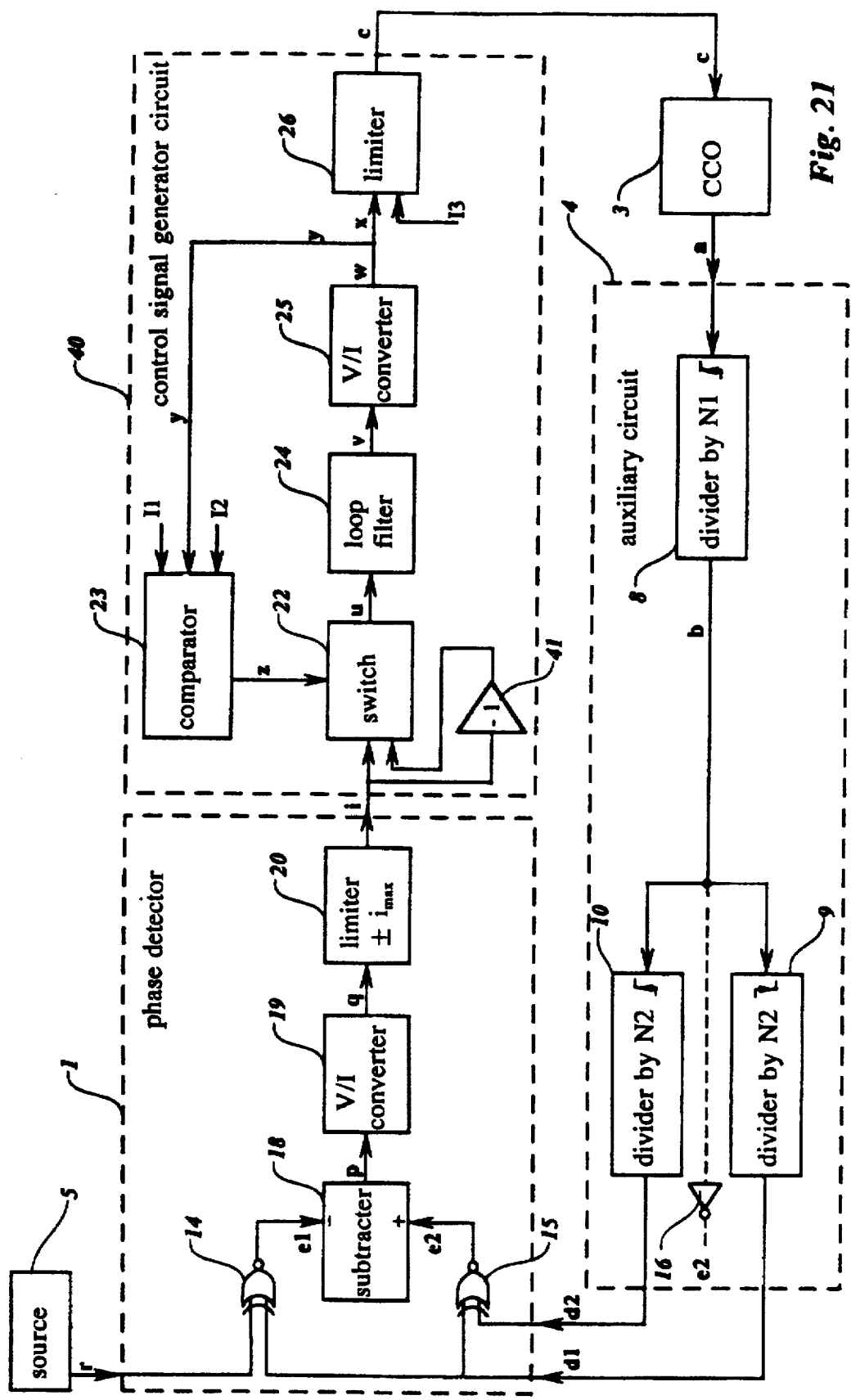
FIGS. 21 to 25 inclusive show more detailed diagrams of second, third, fourth, fifth and sixth embodiments, respectively, of the phase-locked loop according to the invention.

FIG. 21 shows a more detailed diagram of a phase-locked loop according to the invention. The diagram of FIG. 21 differs from the diagram of FIG. 10 in that the control signal generator circuit 2 is replaced by the control signal generator circuit 40 having an analog inverter 41 which receives the output signal i of the phase detector 1, inverts its polarity and delivers to the switch 22 the output signal −i obtained in this process instead of the return current −Ir of FIG. 10.

Figure 22:
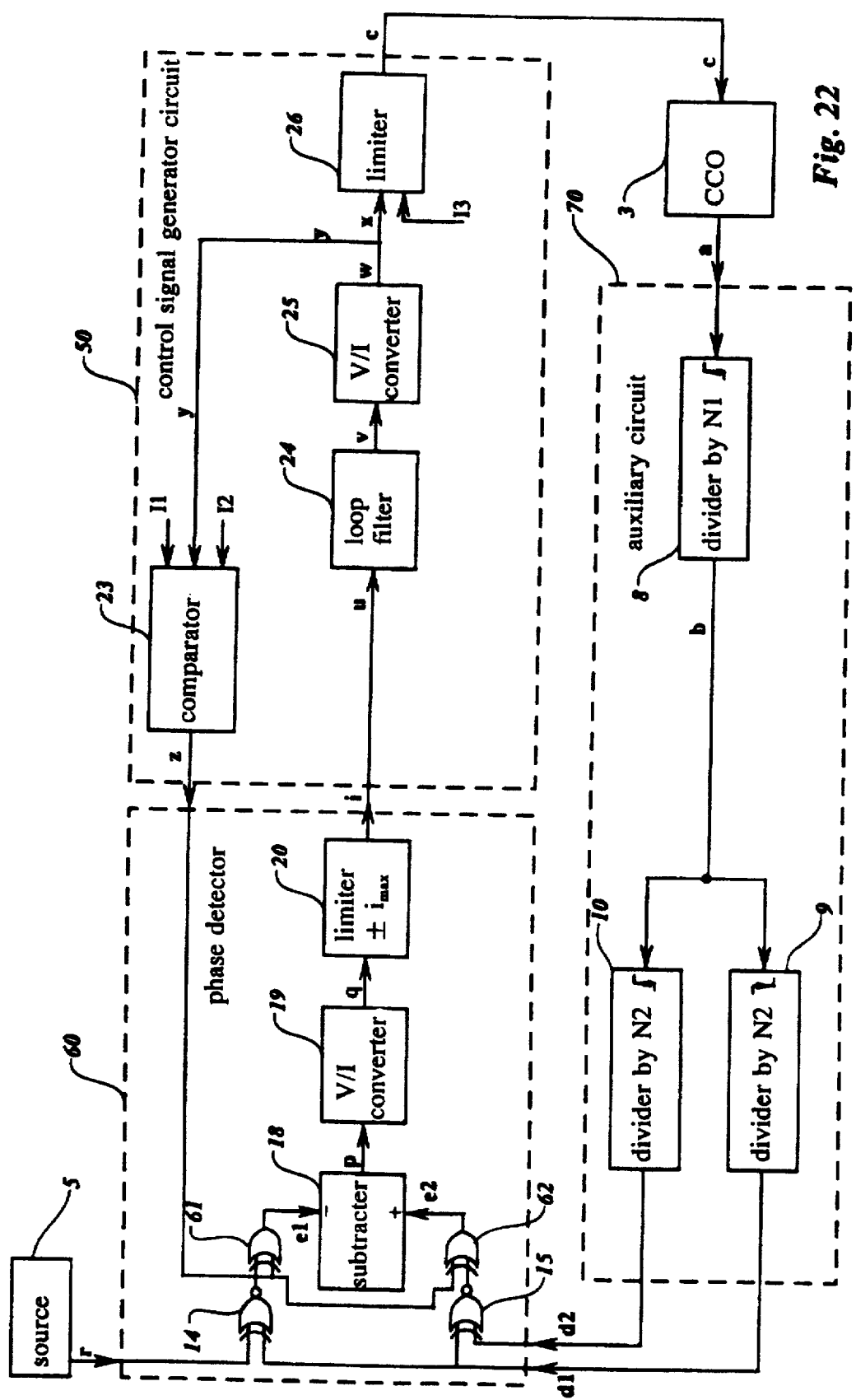

FIG. 22 shows a diagram of a third embodiment of the phase-locked loop according to the invention. The diagram of FIG. 22 has a control signal generator circuit 50 which differs from the control signal generator circuit 2 of FIG. 10 in that the switch 22 is omitted and the input signal u of the loop filter 24 is formed by the output signal i of the phase detector 60 of FIG. 22. The phase detector 60 differs from the phase detector 1 of FIG. 10 in that a first controlled inverter in the form of an exclusive OR gate 61 is provided in the path of the first combination signal e1 and in that a second controlled inverter in the form of an exclusive OR gate 62 is provided in the path of the second combination signal e2. The first controlled inverter 61 receives the output signal of the exclusive NOR gate 14 and the return control signal z from the comparator 23. The second controlled inverter 62 receives the output signal of the exclusive NOR gate 15 and the return control signal z from the comparator 23. Depending on the logic state of the output signal of the comparator 23, the controlled inverters 61 and 62 will invert he output signal of the exclusive NOR gate 14 or of the exclusive NOR gate 15, respectively, or in other words, they will invert the actual first and second combination signals e1 and e2, respectively. During the inversion, the polarity of the output signal p of the subtracter 18 will invert and therefore ultimately also the output signal i of the phase detector 60 and of the input signal u of the loop filter 24.

Because the output signal b 0f the firs divider 8 is no longer a direct representation of the second combination signal e2 as a consequence of the influence of the output signal of the comparator 23 on the first and second combination signals e1 and e2, the inverter 16 of the auxiliary circuit 4 of FIG. 10 has been omitted and the auxiliary circuit in FIG. 22 is represented by an auxiliary circuit 70.

The specific duty cycle $N_d$ mentioned above can be defined more precisely for the text below by the duty cycle of a waveform which is obtained if the first and second comparison signals d1, d2 are combined by means of an exclusive OR function. With this in mind, it also appears possible to arrange for the input signal u of the loop filter 24 to invert in polarity on reaching an extreme oscillator frequency $f_{min}$ or $f_{max}$ by complementing said duty cycle $N_d$(with respect to one). This can be achieved in a relatively simple manner with each of the diagrams, shown in FIGS. 23, 24 and 25, of fourth, fifth and sixth embodiments, respectively, of the phase-locked loop according to the invention.

Figure 23:
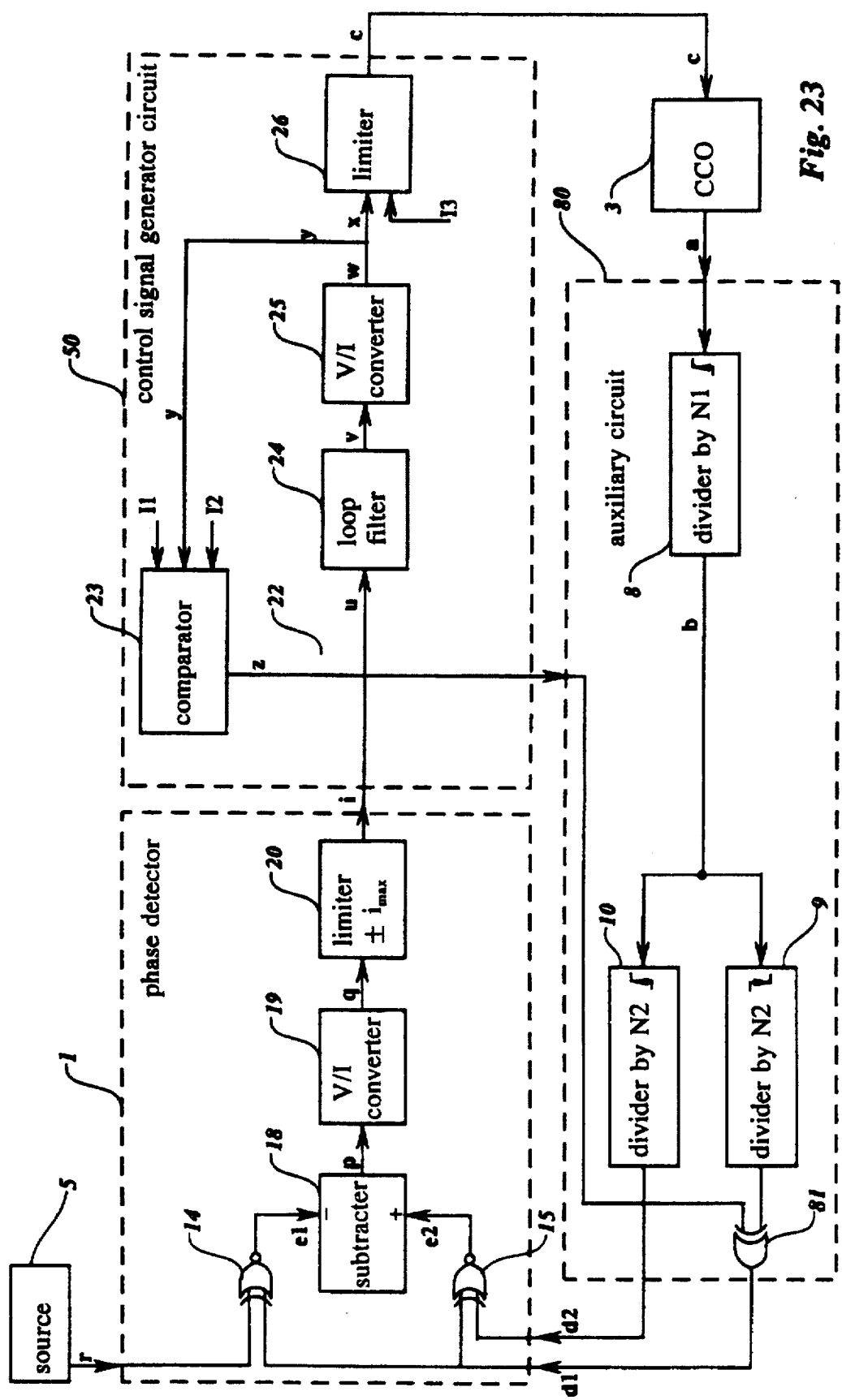
Figure 24:
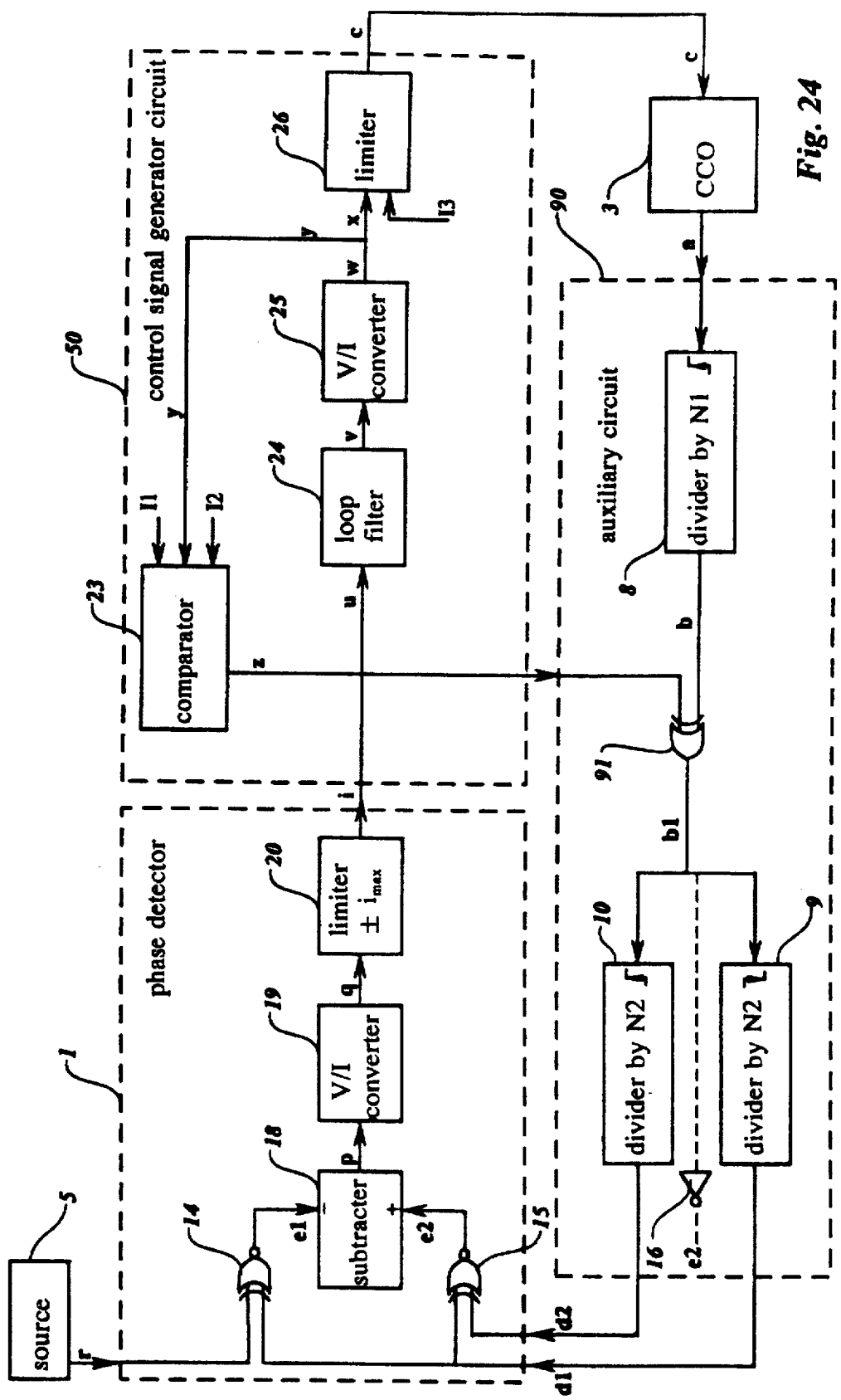
Figure 25:
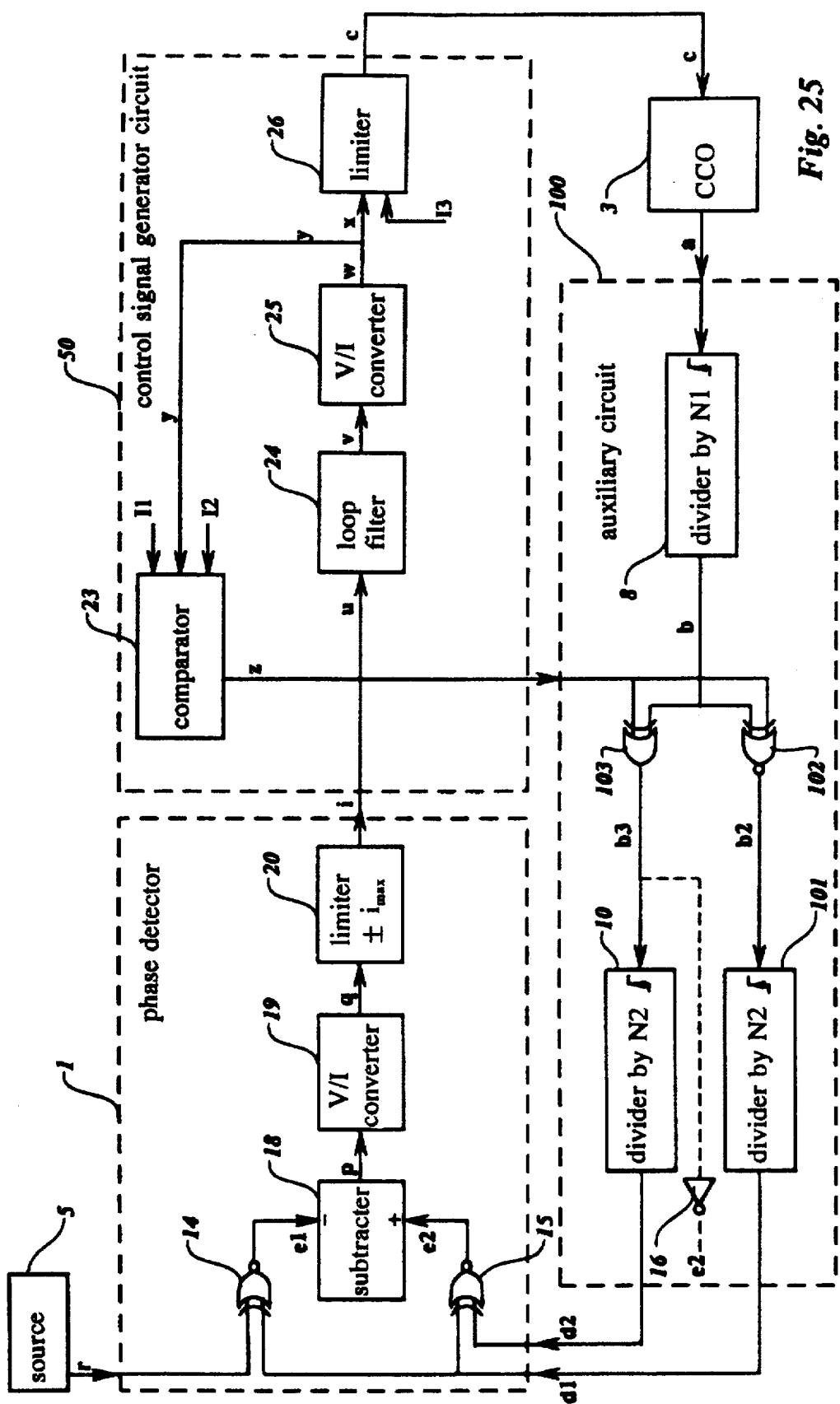

The diagrams according to FIGS. 23, 24 and 25 differ from the diagram shown in FIG. 10 in that the control signal generator circuit 2 is replaced by the control signal generator circuit 50 explained above by reference to FIG. 22 and in that the auxiliary circuit 4 is replaced by an auxiliary circuit 80, 90 and 100 respectively.

In the diagram of FIG. 23, a controlled inverter in the form of an exclusive OR gate 81 is provided in the path of the first comparison signal d1 and receives the output signal of the second divider 9 and the return control signal z from the comparator 23. Depending on the logic state of the output signal of the comparator 23, the con=rolled inverter 81 will or will not invert the output signal of the second divider 9, as a result of which, on the one hand, the first and second combination signals e1, e2 will correspondingly invert and, on the other hand, the actual duty cycle $N_d$ specified in greater detail above is correspondingly complemented to give $1-N_d$.

Because a possible inversion of signals d1, e1, e2 takes place in the diagram of FIG. 23 downstream of the second and third dividers 9, 10, it can no longer be assumed that the output signal b of the first divider 8 is always identical to the second combination signal e2. For these reasons, he inverter 16 of the auxiliary circuit 4 of FIG. 10 has been omitted.

In the diagram of FIG. 24, a controlled inverter in the form of an exclusive OR gate 91 which receives the output signal b of the first divider 8 and the return control signal z from the comparator 23 and which provides an output signal b1 to the second and third dividers 9, 10 is provided in the signal path of the output signal b of the first divider 8. Depending on the logic state of the return control signal z, the controlled inverter 91 will or will not invert the output signal b of the first divider 8, as a result of which the second and third dividers 9, 10 will or will not switch edges going in the opposite direction, as a result of which the actual duty cycle $N_d$ specified more precisely above is or is not complemented to form $1-N_d$.

The diagram of FIG. 25 differs from the diagram of FIG. 24 in that the second divider 9 is replaced by a divider 101 which, just like the other dividers, switches at edges going in the same direction. Furthermore, a first controlled inverter in the form of an exclusive NOR gate 102 is provided in the signal path of the output signal b of the first divider 8 to the second divider 101 and a second controlled inverter in the form of an exclusive OR gate 103 is provided in the signal path of the output signal b from the first divider 8 to the third divider 10. Both controlled inverters 102, 103 receive the output signal b of the first divider 8 and the return control signal z from the comparator 23. The first controlled inverter 102 delivers an output signal b2 to the second divider 101. The second controlled inverter 103 delivers an output signal b3 to the third divider 10. Depending on the logic state of the return control signal z, the first and second controlled inverters 102, 103 will or will not invert the output signal b of the first divider 8, the first controlled inverter 102 performing, in addition, a fixed inversion. As a result, the actual specific duty cycle $N_d$ defined in greater detail above is correspondingly altered to $1-N_d$. It will be noted that the second controlled inverter 103 of the diagram of FIG. 25 has the same function as the controlled inverter 91 of the diagram of FIG. 24. The first controlled inverter 102 is primarily added to make it possible to use identical dividers. The input signal b2 necessary therefor could also be obtained by means of an inverter which receives the signal b1 of FIG. 24 or the signal b3 of FIG. 25. The fixed inversion of gate 102 in the diagram of FIG. 25 could also be achieved in another way, for example using a separate inverter for an input signal or output signal of the gate which is then an exclusive OR gate.

Of importance for the diagrams of FIGS. 24 and 25 is the fact that the transit times of the first and second comparison signals d1, d2 are made as equal as possible, starting from the output signal b of the first divider 8. The smaller the transit time difference is, the fewer undesirable parasitic ("spurious") signals which could undesirably disturb the behaviour of the phase-locked loop will occur.

If the phase-locked loop according to the invention is virtually locked and small variations in the phase difference 74 occur in the input signals of the detector, one of which is the reference signal r, the detector 1 delivers an output signal i with narrow pulses having a fundamental frequency of $2f_r$. If the loop is locked, that is to say the frequency difference between the input signals of the phase detector is zero and the predetermined phase difference (in particular, zero) has been reached between said signals, such pulses may occur in the output signal i of the detector as a consequence of inertias, finite switching times and instability of said times of logic elements of the loop. Said pulses, which are parasitic ("spurious") pulses, are, however, very narrow. Although said pulses are filtered by the loop filter, they could cause unwanted parasitic signals in the frequency spectrum of the oscillator 3 which are situated at intervals equal to a multiple of $2f_r$ of the desired oscillator frequency. Parasitic signals having a fundamental frequency of $f_r$ may also occur as a result of imbalance in he operation of the detector. However, parasitic signals having a frequency lower than $f_r$ (subharmonic) will never occur. The amplitude of the parasitic signals in the frequency spectrum of the oscillator 3 becomes smaller, the smaller the width of the parasitic pulses is. The width of the pulses having repetition frequencies $f_r$ and $2f_r$ is inversely proportional to the loop gain of the loop and therefore inversely proportional to a gain factor of an amplifier which is incorporated in the loop and which may be situated in the example in the loop filter 24 and/or the converter 25. As a result, the width of the pulses originating from the phase detector 1 will approach zero for a loop gain of the loop approaching infinity, as a result of which parasitic signals will no longer be present in the frequency spectrum of the oscillator 3. It is therefore preferable that the gain factor of the said amplifier is chosen as high as possible.

In order to prevent false locking conditions on harmonics of the oscillator frequency $f_a$, the minimum oscillator frequency $f_{min}$ is preferably chosen as greater than the total division factor N divided by 2, times the reference frequency $f_r$, that is to say $f_{min} > N/2 \times f_r$, and, in the example explained, $f_{min} > 3 \times f_r$.

We claim:

1. Phase-locked loop, comprising, in series, a phase detector, a control signal generator circuit having a loop filter, and a controlled oscillator which delivers an oscillator output signal having oscillator frequency ($f_a$) between two extreme oscillator frequencies ($f_{min}$, $f_{max}$), a first input of the detector receiving from outside the loop a reference signal having a rectangular waveform with a reference frequency ($f_r$) and with a duty cycle between the values zero and one, a second input of the detector receiving a first comparison signal derived from the oscillator output signal and having the same form as the reference signal, the detector operating at coincidence or noncoincidence of input signals it receives, the detector deriving a first combination signal by performing a logic combination function for the reference signal and the first comparison signal, the detector delivering an output signal, dependent on the first combination signal of the detector and the detector and the control signal generator circuit being designed so that, with no frequency difference and with a phase difference between the reference signal and another input signal of the phase detector with the loop operating in a state with an immediate capture range of the loop, the control signal generator circuit delivering a control signal to the oscillator which is suitable for setting the phase difference to a predetermined valve operating in a locked state having a predetermined quiescent value of the oscillator control signal after reaching the predetermined phase difference, characterized in that an auxiliary circuit is provided between the oscillator and the detector to receive the output signal of the oscillator and to deliver to the detector the first comparison signal and a third input signal the third input signal is such that if it were to be combined by means of an exclusive OR function with the first comparison signal a waveform results which has twice the frequency of the first comparison signal and a specific duty cycle ($N_d$) which differs from the duty cycle of the waveform of the reference signal the detector has a third input for receiving the third input signal the detector derives from input signals received from the auxiliary circuit a second combination signal having the waveform with the specific duty cycle ($N_d$), the detector has a subtracter circuit which subtracts the first combination signal in an analog manner from the second combination signal the output signal of the detector is determined by the difference determined by the subtracter the control signal generator circuit generates at a frequency difference between the reference signal and another input signal of the phase detector an averaged value of the output signal the detector as seen over a number of cycles of the reference signal which is not equal to a value associated with the quiescent value of the oscillator control signal and at the same time alters the oscillator control signal to arrange for the oscillator frequency ($f_a$) to be altered by the oscillator and the control signal generator circuit adjusts the loop on reaching one extreme oscillator frequency and, in doing so, alters the oscillator control signal so that the oscillator frequency ($f_a$) is driven in an opposite direction to the other extreme oscillator frequency.

2. Phase-locked loop according to claim 1, characterized in that the loop filter has a transfer characteristic containing an integrating term.

3. Phase-locked loop according to claim 1, characterized in that the auxiliary circuit is a phase shift circuit.

4. Phase-locked loop according to claim 3, characterized in that the phase shift circuit has a series of gates which receives the first comparison signal and which delivers a second comparison signal delayed with respect thereto as third input signal to the detector.

5. Phase-locked loop according to claim 1, characterized in that the auxiliary circuit comprises dividers which divide the output signal of the oscillator and logically combine output signals thereof to form the first and second comparison signals.

6. Phase-locked loop according to claim 5, characterized in that a first divider of the auxiliary circuit divides the output signal of the oscillator by a first factor (N1), a logic circuit of the first divider combines internal signals thereof to form an output signal of the first divider having the specific duty cycle ($N_d$), and a second divider of the auxiliary circuit divides a signal derived from the oscillator output signal by a second factor (N2) in order to deliver an output signal which determines the first comparison signal the oscillator frequency ($f_a$) being, in the locked state of the loop, equal to the product of the reference frequency ($f_r$), the first factor (N1) and the second factor (N2) ($f_a = f_r N1\,N2$).

7. Phase-locked loop according to claim 6, characterized in that the auxiliary circuit has an inverter which receives the output signal of the first divider having the specific duty cycle ($N_d$) and which delivers the third signal as second combination signal to the detector.

8. Phase-locked loop according to claim 6, characterized in that the auxiliary circuit has a third division derived from the oscillator output signal having the specific duty cycle ($N_d$) by the second factor (N2), the third divider switches at edges of the oscillator output signal having the specific duty cycle ($N_d$) other than edges at which the second divider switches, and the third divider delivers the second comparison signal.

9. Phase-locked loop according to claim 1, characterized in that the control signal generator circuit has, in addition to the loop filter a comparator, an input of the loop filter is coupled to an output of the phase detector, a signal derived from the output signal of the loop filter determines the output signal of the control signal generator circuit as oscillator control signal, the comparator receives a third comparison signal derived from the output signal of the loop filter and two reference levels inverter means are provided in the loop, and in that, if the third comparison signal exceeds one of the two reference levels in a direction starting from the other reference level, an output signal of the comparator as return control signal activates the inverting means in order to invert one or more signals received by the inverter means and in order thereby to invert the polarity thereby of the input signal of the loop filter.

10. Phase-locked loop according to claim 9, characterized in that the inverter means comprise means, connected in a signal path between the subtracter and the loop filter for inverting the polarity of the input signal of the loop filter in response to the return control signal.

11. Phase-locked loop according to claim 10, characterized in that the inverting means comprise a switch connected between the phase detector and the loop filter and a source, connected to the switch of a control signal-return signal having constant level and having a polarity which is opposite to a polarity of the output signal of the detector in the event of a frequency difference between the input signals of the detector as viewed over a number of cycles of the reference signal and the switch allows the output signal of the detector or the return signal through to the loop filter in response to the return control signal.

12. Phase-locked loop according to claim 9, characterized in that the inverting means comprise a switch connected between the phase detector and the loop filter and an inverter which is connected between the switch and the phase detector and which inverts the polarity of the output signal of the detector, and the switch allows the output signal of the detector or the output signal of the inverter through to the loop filter in response to the return control signal.

13. Phase-locked loop according to claim 9, characterized in that the inverting means comprise first and second controlled inverters in the paths of the first and second combination signals, respectively, and the inverters invert or do not invert the first and second combination signals, respectively, in response to the return control signal.

14. Phase-locked loop according to claim 9, characterized in that the inverter means complement the current specific duty cycle ($N_d$) in response to the return control signal.

15. Phase-locked loop according to claim 14, characterized in that the inverter means comprise a controlled inverter in the path of the first comparison signal and the inverter inverts or does not invert the first comparison signal in response to the return control signal.

16. Phase-locked loop according to claim 8, characterized in that the control signal generator circuit has, in addition to the loop filter, a comparator, an input of the loop filter is coupled to an output of the phase detector a signal derived from the output signal of the loop filter determines the output signal of the control signal generator circuit as oscillator control signal, the comparator receives a third comparison signal derived from the output signal of the loop filter and two reference levels, inverter means are provided in the loop, and in that, if the third comparison signal exceeds one of the two reference levels in a direction starting from the other reference level, an output signal of the comparator as return control signal activates the inverting means in order to invert one or more signals received by the inverter means and in order thereby to invert the polarity thereby of the input signal of the loop filter wherein said phase-locked loop is further characterized in that the inverter means complement the current specific duty cycle ($N_d$) in response to the return control signal; and wherein said phase-locked loop is further characterized in that the inverting means comprise a controlled inverter between the output of the first divider and the inputs of the second and third dividers the second divider and the third divider switching at edges, going in opposite directions, of their common input signal, and the inverter inverting or not inverting the output signal of the first divider in response to the return control signal.

17. Phase-locked loop according to claim 8, characterized in that the control signal generator circuit has, in addition to the loop filter, a comparator an input of the loop filter is coupled to an output of the phase detector a signal derived from the output signal of the loop filter determines the output signal of the control signal generator circuit as oscillator control signal, the comparator receives a third comparison signal derived from the output signal of the loop filter and two reference levels, inverter means are provided in the loop, and in that, if the third comparison signal exceeds one of the two reference levels in a direction starting from the other reference level, an output signal of the comparator as return control signal activates the inverting means in order to invert one or more signals received by the inverter means and in order thereby to invert the polarity thereby of the input signal of the loop filter wherein said phase-locked loop is further characterized in that the inverter means complement the current specific duty cycle ($N_d$) in response to the return control signal; and wherein said phase-locked loop is further characterized in that the inverting means comprise first and second controlled inverters between the output of the first divider and the input of the second divider and the input of the third divider, respectively, the inverters being of different types which deliver inverted signals with respect to one another, the second divider and the third divider switching at edges, going in the same direction, of their respective input signals and the inverters inverting or not inverting the output signal of the first divider in response to the return control signal.

18. Phase-locked loop according to claim 1, characterized in that the control signal generator circuit has at its output a limiter which limits the control signal it delivers to a third reference level.

19. Phase-locked loop according to claim 1, characterized in that the control signal generator circuit has an amplifier connected to the output side of the loop filter and having a high gain factor to amplify the output signal of the loop filter.

20. Phase-locked loop according to claim 6 to inclusive, characterized in that the lowest ($f_{min}$) of the extreme frequencies ($f_{min}$, $f_{max}$) is greater than the total division factor ($N=N1 \cdot N2$) divided by two, times the reference frequency ($f_r$) ($f_{min}>N/2 \cdot f_r$).

21. Phase-locked loop according to claim 1, characterized in that the oscillator is a current-controlled oscillator, and the detector and the control signal generator circuit have means which deliver currents as input signals to one or more of: a present switch a comparator a limiter, and the oscillator.

22. A phase-locked loop comprising:

a phase detector having a first input for receiving a reference signal having a frequency $f_r$, a second input for receiving a first auxiliary circuit output signal, and a third input for receiving a second auxiliary circuit output signal, and in response to the first, second and third inputs, generating a detector output signal;

a control signal generator circuit for receiving said detector output signal and generating an oscillator control signal; and an oscillator for receiving said oscillator control signal and generating an oscillator output signal having an oscillator frequency $f_a$; and an auxiliary circuit for receiving said oscillator output signal and for generating said first auxiliary circuit output signal and said second auxiliary circuit output signal by dividing said oscillator output signal.

23. The phase-locked loop according to claim 22, wherein the auxiliary circuit comprises:

a first divider for dividing the oscillator output signal by a first factor of N1 to generate a first divider output signal;

a second divider for dividing the first divider output signal by a second factor of N2, the second divider generating a second divider output signal; and a third divider for dividing the first divider output signal by said second factor of N2, the third divider generating a third divider output signal.

24. The phase-locked loop according to claim 23, wherein the second divider output signal provides the first auxiliary circuit output signal, and the third divider output signal provides the second auxiliary circuit output signal.

25. The phase-locked loop according to claim 23, wherein the second divider and the third divider switch at different edges of their respective input signals.

26. The phase-locked loop according to claim 23, wherein the oscillator frequency $f_a$ is equal to the product of the reference frequency $f_r$, the first factor N1 and the second factor N2 in the locked state of the loop.

27. The phase-locked loop according to claim 22, wherein the auxiliary circuit comprises:

a first divider for dividing the oscillator output signal by a first factor of N1 to generate a first divider output signal;

a second divider for dividing the first divider output signal by a second factor of N2, the second divider generating a second divider output signal; and an inverter for inverting the first divider output signal to generate an inverter output signal.

28. The phase-locked loop according to claim 27, wherein the second divider output signal provides the first auxiliary circuit output signal, and the inverter output signal provides the second auxiliary circuit output signal.

29. The phase-locked loop according to claim 22, wherein the phase detector further comprises:

a first combination logic circuit for receiving said reference signal and said first auxiliary circuit output signal, and generating a first combination logic circuit output; and a second combination logic circuit for receiving said first auxiliary circuit output signal and said second auxiliary circuit output signal, and generating a second combination logic circuit output.

30. The phase-locked loop according to claim 29, wherein said first and second combination logic circuits comprises exclusive OR gates.

31. The phase-locked loop according to claim 29, wherein said phase detector further comprises:

a subtracter for receiving said first combination logic circuit output and said second combination logic output, for determining the difference therebetween, and for generating a subtractor output signal indicative of said difference.

32. The phase-locked loop according to claim 22, wherein said control signal generator circuit includes:

a loop filter for receiving an input based on the phase detector output signal, and for generating a loop filter output signal; and a comparator for receiving an input based on the output of said loop filter, and for generating a return control signal, said comparator also receiving a first and a second reference signals, said comparator determining whether said input based on the output of said loop filter exceeds one of the two reference signals.

33. The phase-locked loop according to claim 32, further including:

an inverter located in the loop for receiving said return control signal from said comparator, and for inverting an input based on the return control signal.

34. The phase-locked loop according to claim 33, wherein said inverter is interposed between said phase detector and said loop filter, and wherein said inverter inverts the polarity of the input signal of the loop filter in response to the return control signal.

35. The phase-locked loop according to claim 34, wherein the inverter comprises a switch having a first input connected to an output of the phase detector, and having a second input connected to a control signal-return signal having a constant level and having a polarity which is opposite to a polarity of the output of the phase detector, and wherein the switch selects between the first input and the second input based on the return control signal.

36. The phase-locked loop according to claim 34, wherein the inverter comprises a switch having a first input connected to an output of the phase detector, and having a second input connected to the output on a signal inverter, wherein the signal inverter inverts the output of the phase detector, and wherein the switch selects between the first input and the second input based on the return control signal.

37. The phase-locked loop according to claim 33, further comprising:

a first combination logic circuit for receiving said reference signal and said first auxiliary circuit output signal, and generating a first combination logic circuit output; and a second combination logic circuit for receiving said first auxiliary circuit output signal and said second auxiliary circuit output signal, and generating a second combination logic circuit output;

wherein the inverter comprises a first and second inverters for inverting the first combination logic circuit output and the second combination logic circuit output, respectively, wherein the first and the second inverters invert the first and second combination logic circuits outputs based on the return control signal.

38. The phase-locked loop according to claim 33, wherein the auxiliary circuit comprises:

a first divider for dividing the oscillator output signal by a first factor of NI to generate a first divider output signal;

a second divider for dividing the first divider output signal by a second factor of N2, the second divider generating a second divider output signal; and a third divider for dividing the first divider output signal by said second factor of N2, the third divider generating a third divider output signal.

39. The phase-locked loop according to claim 38, wherein the inverter receives the second divider output signal and inverts this signal based on the return control signal.

40. The phase-locked loop according to claim 38, wherein the inverter receives the first divider output signal and inverts this signal based on the return control signal.

41. The phase-locked loop according to claim 38, wherein the inverter comprises a first and second inverters which respectively invert the inputs to the second and third dividers based on the return control signal.

42. The phase-locked loop according to claim 22, wherein the oscillator comprises a current controlled oscillator.

* * * * *